US009344077B2

(12) United States Patent
Callanan

(10) Patent No.: US 9,344,077 B2
(45) Date of Patent: May 17, 2016

(54) HIGH VOLTAGE DRIVER

(75) Inventor: Robert J. Callanan, Raleigh, NC (US)

(73) Assignee: Cree, Inc., Durham, NC (US)

( * ) Notice: Subject to any disclaimer, the term of this patent is extended or adjusted under 35 U.S.C. 154(b) by 11 days.

(21) Appl. No.: 13/438,927

(22) Filed: Apr. 4, 2012

(65) Prior Publication Data

US 2013/0265084 A1  Oct. 10, 2013

(51) Int. Cl.
*H03B 1/00* (2006.01)
*H03K 17/06* (2006.01)
*H03K 17/30* (2006.01)

(52) U.S. Cl.
CPC ........ *H03K 17/063* (2013.01); *H03K 2017/307* (2013.01); *H03K 2217/0081* (2013.01)

(58) Field of Classification Search
CPC ......... H02M 3/07; H02M 3/073; G11C 5/145
See application file for complete search history.

(56) References Cited

U.S. PATENT DOCUMENTS

| 5,923,311 | A | * | 7/1999 | Edwards | 345/92 |
| 6,100,868 | A | * | 8/2000 | Jeong et al. | 345/98 |
| 6,661,276 | B1 | | 12/2003 | Chang | |
| 6,972,973 | B2 | * | 12/2005 | Abe et al. | 363/60 |
| 7,098,703 | B2 | * | 8/2006 | Harvey | 327/111 |
| 7,116,153 | B2 | | 10/2006 | Pai | |
| 7,148,666 | B1 | * | 12/2006 | Tai et al. | 323/274 |
| 2009/0020409 | A1 | * | 1/2009 | Fagrell | 204/157.15 |
| 2011/0163797 | A1 | * | 7/2011 | Posat | 327/537 |
| 2012/0206169 | A1 | | 8/2012 | Kimura | |
| 2012/0306545 | A1 | | 12/2012 | Machida et al. | |
| 2012/0326770 | A1 | * | 12/2012 | Murakami | 327/536 |
| 2013/0106468 | A1 | | 5/2013 | Aso | |

FOREIGN PATENT DOCUMENTS

| DE | 4446327 A1 | 7/1996 |
| DE | 19655180 C2 | 5/2001 |

OTHER PUBLICATIONS

Franke, W-Toke et al., "Comparison of Switching and Conducting Performance of SiC-JFET and SiC-BJT with a State of the Art IGBT," 13th European Conference on Power Electronics and Applications, Sep. 8, 2009, 10 pages.
Author Unknown, "IXD414PI/414YI/414CI/414SI: 14 Amp Low-Side Ultrafast MOSFET Driver," IXYS Corporation, Copyright: 2004, 10 pages.
Rabkowski, Jacek et al., "Low-Loss High-Performance Base-Drive Unit for SiC BJTs," IEEE Transactions on Power Electronics, vol. 27, No. 5, May 2012, pp. 2633-2643.

(Continued)

*Primary Examiner* — Sibin Chen
(74) *Attorney, Agent, or Firm* — Anthony J. Josephson

(57) ABSTRACT

A circuit, which includes a high voltage driver, is disclosed. The high voltage driver includes a P-type field effect transistor (PFET) and a source bias circuit. The source bias circuit receives a low voltage input signal and applies a direct current (DC) bias to the low voltage input signal to provide a DC biased signal. The PFET has a first source, a first gate, and a first drain. The first source receives the DC biased signal. The first gate receives a first low voltage DC supply signal. The first drain provides a high voltage output signal based on the DC biased signal and the first low voltage DC supply signal. In this regard, the high voltage driver receives and translates the low voltage input signal to provide the high voltage output signal.

31 Claims, 7 Drawing Sheets

(56) References Cited

OTHER PUBLICATIONS

Burgos, Rolando et al., "Design Considerations of a Fast 0-Ω Gate-Drive Circuit for 1.2 kV SiC JFET Devices in Phase-Leg Configuration," Energy Conversion Congress and Exposition, Sep. 20, 2009, pp. 2293-2300.

International Search Report for PCT/US2013/065206, mailed Jan. 29, 2014, 13 pages.

International Search Report and Written Opinion for PCT/US2013/034949, mailed Jul. 22, 2013, 12 pages.

Non-Final Office Action for U.S. Appl. No. 13/656,264, mailed May 8, 2014, 7 pages.

International Preliminary Report on Patentability for PCT/US2013/065206, mailed Apr. 30, 2015, 9 pages.

International Preliminary Report on Patentability for PCT/US2013/034949, mailed Oct. 16, 2014, 9 pages.

* cited by examiner

HIGH VOLTAGE DRIVER

FIELD OF THE DISCLOSURE

Embodiments of the present disclosure relate to high voltage and low voltage field effect transistors, which are used in digital circuits, and specific digital circuits, such as drivers.

BACKGROUND

A field effect transistor (FET) is a transistor that relies on an electric field to control conductivity of a channel in a semiconductor material. When the channel is an active channel, majority charge carriers, electrons or holes, flow through the channel from a source of the FET to a drain of the FET. Conductivity of the channel is a function of potential applied between a gate of the FET and the source. In this regard, in an enhancement-mode only FET, when a voltage between the gate and the source exceeds a threshold voltage of the FET, a low-resistance channel is established, such that the majority charge carriers can flow from the drain to the source. Conversely, when the voltage between the gate and the source drops below the threshold voltage of the FET, a high-resistance channel is established, such that the majority charge carrier flow is impeded.

When the FET is used as an electronic switch, the FET has either an ON state, in which current can flow between the source and the drain; or an OFF state, in which current is impeded from flowing between the source and the drain. As such, the FET may operate in the ON state when the voltage between the gate and the source exceeds the threshold voltage of the FET. Conversely, the FET may operate in the OFF state when the voltage between the gate and the source is below the threshold voltage of the FET. Therefore, if the source of the FET is coupled to ground, a voltage swing of a control signal feeding the gate of the FET must exceed the threshold voltage to ensure proper selection between the ON state and the OFF state.

A junction FET (JFET) includes a P-N junction between the gate of the JFET and the channel of the JFET. Normally, JFETs are depletion mode only devices to prevent forward current flow though the P-N junction of the JFET. A metal oxide semiconductor FET (MOSFET) includes an oxide layer between a metal gate of the MOSFET and the channel of the MOSFET to insulate the gate from the channel. It should be noted that the term MOSFET is also commonly used to describe FETs having an oxide layer between a semiconductor gate, instead of a metal gate, of the MOSFET and the channel of the MOSFET to insulate the gate from the channel. The semiconductor gate may include polysilicon. In the present disclosure, the term MOSFET includes any FET with an oxide layer between the gate and the channel. MOSFETs may be enhancement mode only devices, depletion mode only devices, or enhancement mode-depletion mode devices. An N-type FET has a source and a drain with N-type semiconductor material, and a P-type FET has a source and a drain with P-type semiconductor material.

MOSFETs may be used as electronic switches to construct logic circuits, which are commonly used in digital systems. Such logic circuits normally provide output voltage swings that are compatible with the threshold voltages of the MOSFETs used in the logic circuits. However, in some digital systems, certain MOSFETs may be used for special applications, such as high speed, high voltage, high temperature, high current, or the like. Such MOSFETs may have lower transconductance and/or higher threshold voltages than other MOSFETs in the digital system, thereby creating a voltage swing and desired gate voltage incompatibility. As such, there is need for an interface circuit, which receives an input signal having a standard voltage swing and provides an output signal having a larger voltage swing that may be used to properly drive a high gate drive voltage MOSFET.

SUMMARY

Embodiments of the present disclosure relate to a circuit, which includes a high voltage driver having a low voltage input and a high voltage output. The high voltage driver includes a P-type field effect transistor (PFET) and a source bias circuit. The source bias circuit receives a low voltage input signal via the low voltage input and applies a direct current (DC) bias to the low voltage input signal to provide a DC biased signal. The PFET has a first source, a first gate, and a first drain. The first source receives the DC biased signal. The first gate receives a first low voltage DC supply signal. The first drain provides a high voltage output signal via the high voltage output based on the DC biased signal and the first low voltage DC supply signal. In this regard, the high voltage driver receives and translates the low voltage input signal to provide the high voltage output signal, such that a voltage swing of the high voltage output signal is greater than a voltage swing of the low voltage input signal.

By applying the DC bias to the low voltage input signal, the source bias circuit increases the voltage swing of the high voltage output signal beyond the voltage swing of the low voltage input signal. In one embodiment of the circuit, the circuit further includes a low voltage logic driver coupled to the low voltage input. As such, the low voltage logic driver provides the low voltage input signal via the low voltage input. In one embodiment of the high voltage driver, the source bias circuit is coupled between the low voltage input and the first source. The first gate is coupled to a first low voltage DC supply, which provides the first low voltage DC supply signal. The first drain is coupled to the high voltage output. In this regard, since the voltage swing of the high voltage output signal is greater than the voltage swing of the low voltage input signal, a voltage swing capability of the high voltage output is greater than a voltage swing capability of the low voltage input.

In one embodiment of the circuit, the circuit further includes a high gate drive voltage field effect transistor (FET). The high gate drive voltage FET may have a lower transconductance and/or higher threshold voltage than other FETs. As such, the high gate drive voltage FET may require a higher gate voltage than other FETs to properly transition from an OFF state to an ON state. Therefore, the greater voltage swing of the high voltage output signal may be needed for proper operation of the high gate drive voltage FET. As such, the first drain is coupled to a gate of the high gate drive voltage FET via the high voltage output. In one embodiment of the high gate drive voltage FET, the high gate drive voltage FET is a silicon carbide FET.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
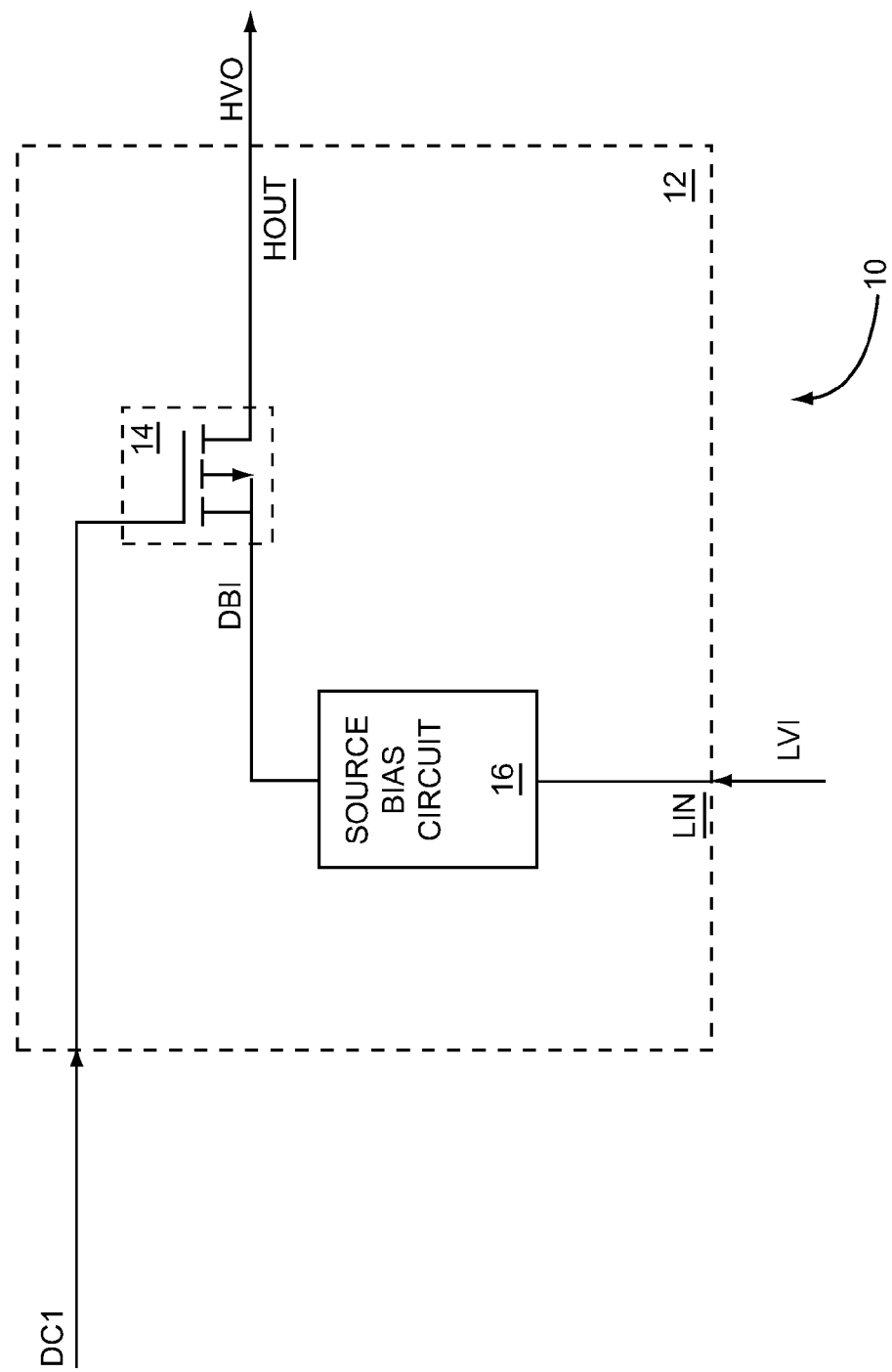
FIG. 1 illustrates a circuit, which includes a high voltage driver according to one embodiment of the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure relate to a circuit, which includes a high voltage driver having a low voltage input and a high voltage output. The high voltage driver includes a (P-type field effect transistor) PFET and a source bias circuit. The source bias circuit receives a low voltage input signal via the low voltage input and applies a DC bias to the low voltage input signal to provide a DC biased signal. The PFET has a first source, a first gate, and a first drain. The first source receives the DC biased signal. The first gate receives a first low voltage DC supply signal. The first drain provides a high voltage output signal via the high voltage output based on the DC biased low voltage input signal and the first low voltage DC supply signal. In this regard, the high voltage driver receives and translates the low voltage input signal to provide the high voltage output signal, such that a voltage swing of the high voltage output signal is greater than a voltage swing of the low voltage input signal.

By applying the DC bias to the low voltage input signal, the source bias circuit increases the voltage swing of the high voltage output signal beyond the voltage swing of the low voltage input signal. In one embodiment of the circuit, the circuit further includes a low voltage logic driver coupled to the low voltage input. As such, the low voltage logic driver provides the low voltage input signal via the low voltage input. In one embodiment of the high voltage driver, the source bias circuit is coupled between the low voltage input and the first source. The first gate is coupled to a first low voltage DC supply, which provides the first low voltage DC supply signal. The first drain is coupled to the high voltage output. In this regard, since the voltage swing of the high voltage output signal is greater than the voltage swing of the low voltage input signal, a voltage swing capability of the high voltage output is greater than a voltage swing capability of the low voltage input.

In one embodiment of the circuit, the circuit further includes a high gate drive voltage field effect transistor (FET). The high gate drive voltage FET may have a lower transconductance and/or higher threshold voltage than other FETs. As such, the high gate drive voltage FET may require a higher gate voltage than other FETs to properly transition from an OFF state to an ON state. Therefore, the greater voltage swing of the high voltage output signal may be needed for proper operation of the high gate drive voltage FET. As such, the first drain is coupled to a gate of the high gate drive voltage FET via the high voltage output. In one embodiment of the high gate drive voltage FET, the high gate drive voltage FET is a silicon carbide FET.

FIG. 1 illustrates a circuit 10, which includes a high voltage driver 12 according to one embodiment of the present disclosure. The high voltage driver 12 has a low voltage input LIN and a high voltage output HOUT. Further, the high voltage driver 12 includes a PFET 14 and a source bias circuit 16. In this regard, the PFET 14 and the source bias circuit 16 form the high voltage driver 12. The PFET 14 has a first source, a first gate, and a first drain. The source bias circuit 16 receives a low voltage input signal LVI via the low voltage input LIN and applies a DC bias to the low voltage input signal LVI to provide a DC biased signal DBI. The first source receives the DC biased signal DBI. The first gate receives a first low voltage DC supply signal DC1. The first drain provides a high voltage output signal HVO via the high voltage output HOUT based on the DC biased signal DBI and the first low voltage DC supply signal DC1. In this regard, the high voltage driver 12 receives and translates the low voltage input signal LVI to provide the high voltage output signal HVO, such that a voltage swing of the high voltage output signal HVO is greater than a voltage swing of the low voltage input signal LVI.

By applying the DC bias to the low voltage input signal LVI, the source bias circuit 16 increases the voltage swing of the high voltage output signal HVO beyond the voltage swing of the low voltage input signal LVI. In one embodiment of the high voltage driver 12, the voltage swing of the high voltage output signal HVO is on the order of about two times the voltage swing of the low voltage input signal LVI. In a first exemplary embodiment of the high voltage driver 12, the voltage swing of the high voltage output signal HVO is equal to about 6 volts and the voltage swing of the low voltage input signal LVI is equal to about 3.3 volts. In a second exemplary embodiment of the high voltage driver 12, the voltage swing of the high voltage output signal HVO is equal to about 19.4 volts and the voltage swing of the low voltage input signal LVI is equal to about 10 volts.

The source bias circuit 16 is coupled between the low voltage input signal LVI and the first source. The first drain is coupled to the high voltage output HOUT. In this regard, since the voltage swing of the high voltage output signal HVO is greater than the voltage swing of the low voltage input signal LVI, a voltage swing capability of the high voltage output HOUT is greater than a voltage swing capability of the low voltage input LIN. In one embodiment of the PFET 14, the PFET 14 is a metal oxide semiconductor FET (MOSFET). In an alternate embodiment of the PFET 14, the PFET 14 is a junction FET (JFET). In additional embodiments of the PFET 14, the PFET 14 is any type of FET. In one embodiment of the circuit 10, the source bias circuit 16 is directly coupled between the low voltage input signal LVI and the first source, and the first drain is directly coupled to the high voltage output HOUT.

Figure 2:
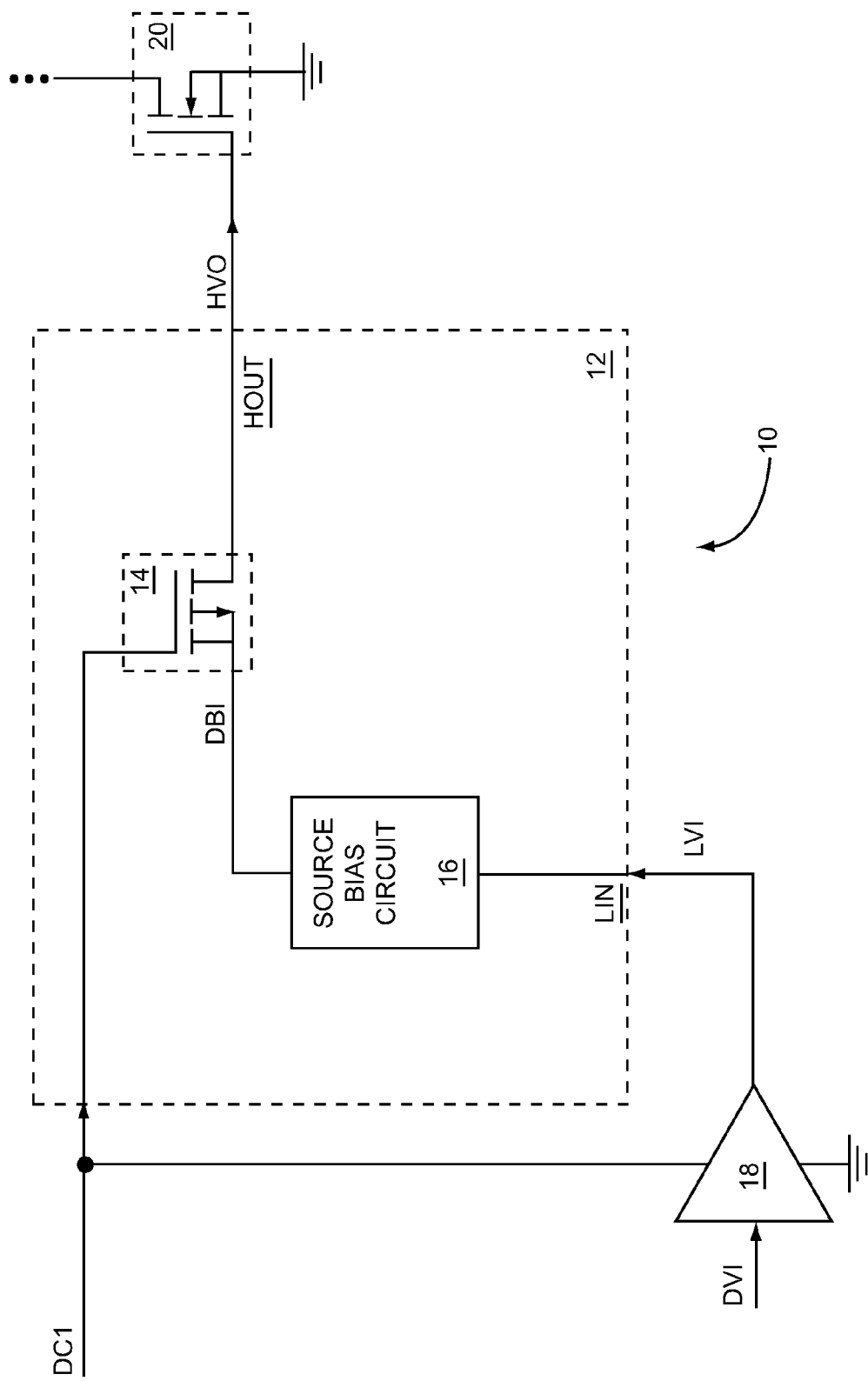
FIG. 2 illustrates the circuit, which further includes a low voltage logic driver and a high gate drive voltage field effect transistor according to an alternate embodiment of the circuit.

FIG. 2 illustrates the circuit 10 according to an alternate embodiment of the circuit 10. The circuit 10 illustrated in FIG. 2 is similar to the circuit 10 illustrated in FIG. 1, except the circuit 10 illustrated in FIG. 2 further includes a low voltage logic driver 18 and a high gate drive voltage FET 20.

The low voltage logic driver 18 is coupled to the low voltage input LIN. Further, the low voltage logic driver 18 receives a driver input signal DVI and provides the low voltage input signal LVI to the high voltage driver 12 via the low voltage input LIN. As such, the low voltage input signal LVI is based on the driver input signal DVI. A gate of the high gate drive voltage FET 20 is coupled to the first drain via the high voltage output HOUT. As such, the gate of the high gate drive voltage FET 20 receives the high voltage output signal HVO via the high voltage output HOUT. A source of the high gate drive voltage FET 20 is coupled to a ground. A drain of the high gate drive voltage FET 20 is coupled to other circuitry (not shown). In one embodiment of the circuit 10, the low voltage logic driver 18 is directly coupled to the low voltage input LIN and the gate of the high gate drive voltage FET 20 is directly coupled to the first drain via the high voltage output HOUT.

The high gate drive voltage FET may have a lower transconductance and/or higher threshold voltage than other FETs. As such, the high gate drive voltage FET 20 may require a higher gate voltage than other FETs to properly transition from an OFF state to an ON state. Therefore, the greater voltage swing of the high voltage output signal HVO may be needed for proper operation of the high gate drive voltage FET 20. In this regard, in an exemplary embodiment of the high voltage driver 12, the high voltage driver 12 is a high voltage logic driver, a high voltage gate driver, or both. In one embodiment of the high gate drive voltage FET 20, the high gate drive voltage FET 20 is a SiC FET. SiC FETs may be used in applications requiring high speed, high voltage, high temperature, high current, the like, or any combination thereof. In one embodiment of the high gate drive voltage FET 20, the high gate drive voltage FET 20 is an N-type FET, as illustrated in FIG. 2. In an alternate embodiment f the high gate drive voltage FET 20, the high gate drive voltage FET 20 is a P-type FET. In one embodiment of the high gate drive voltage FET 20, the high gate drive voltage FET 20 is a MOSFET. In an alternate embodiment of the high gate drive voltage FET 20, the high gate drive voltage FET 20 is a JFET. In additional embodiments of the high gate drive voltage FET 20, the high gate drive voltage FET 20 is any type of FET.

Figure 3:
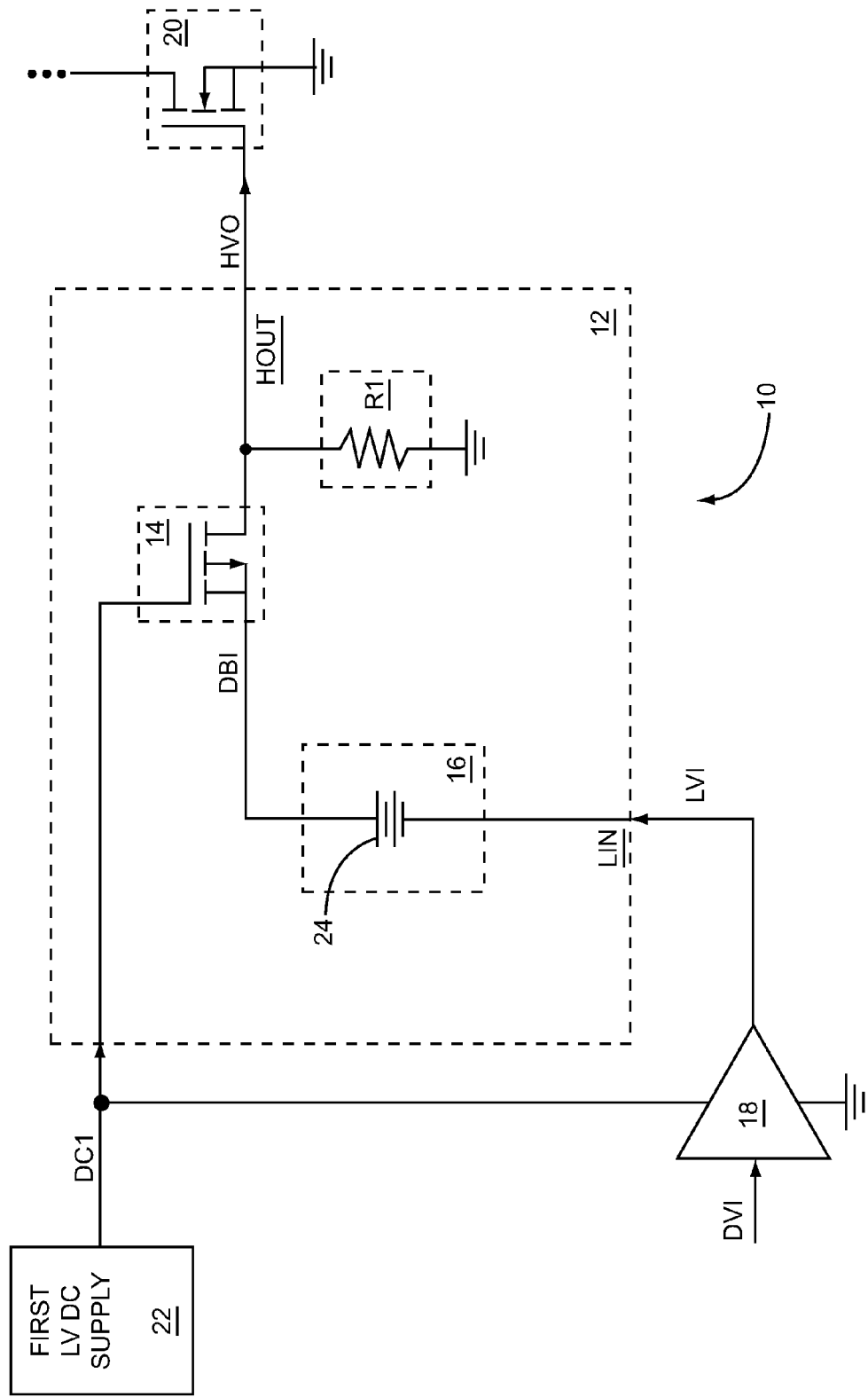
FIG. 3 illustrates the circuit, which further includes a first low voltage DC supply according to an additional embodiment of the circuit.

FIG. 3 illustrates the circuit 10 according to an additional embodiment of the circuit 10. The circuit 10 illustrated in FIG. 3 is similar to the circuit 10 illustrated in FIG. 2, except the circuit 10 illustrated in FIG. 3 further includes a first low voltage DC supply 22. The first low voltage DC supply 22 is coupled to the first gate and to the low voltage logic driver 18. As such, the first low voltage DC supply 22 provides the first low voltage DC supply signal DC1. In this regard, the first low voltage DC supply 22 provides energy to translate the low voltage input signal LVI to provide the high voltage output signal HVO. In one embodiment of the circuit 10, the first low voltage DC supply 22 is directly coupled to the first gate and to the low voltage logic driver 18.

The high voltage driver 12 further includes a first resistive element R1 coupled between the first drain and a ground. The source bias circuit 16 includes a battery 24 coupled between the low voltage input LIN and the first source. The battery 24 has an anode and a cathode, such that the cathode is coupled to the first source and the anode is coupled to the low voltage input LIN. The cathode is positive with respect to the anode. Therefore, the battery 24 applies a DC bias to the low voltage input signal LVI, such that the DC biased signal DBI has a positive bias with respect to the low voltage input signal LVI.

A description of the operation of the high voltage driver 12 is presented. When the low voltage input signal LVI is a logic LOW, the low voltage input signal LVI may be equal to about zero volts. As such, a voltage of the DC biased signal DBI is positive and is about equal to a voltage of the battery 24. Therefore, if a difference between the voltage of the DC biased signal DBI and a voltage of the first low voltage DC supply signal DC1 is less than a threshold voltage of the PFET 14, then the PFET 14 will be in an OFF state. As a result, the first resistive element R1 will pull the high voltage output signal HVO to about zero volts, which is a logic LOW. However, when the low voltage input signal LVI is a logic HIGH, the low voltage input signal LVI is about equal to the voltage of the first low voltage DC supply signal DC1. As a result, the voltage of the DC biased signal DBI will be equal to the sum of the voltage of the first low voltage DC supply signal DC1 and the voltage of the battery 24. Therefore, if the difference between the voltage of the DC biased signal DBI and the voltage of the first low voltage DC supply signal DC1 is greater than the threshold voltage of the PFET 14, then the PFET 14 will be in an ON state. As a result, the PFET 14 will drive the high voltage output signal HVO to be about equal to the DC biased signal DBI, which is a logic HIGH.

In this regard, the high voltage driver 12 translates a voltage swing of the low voltage input signal LVI, which is about equal to the voltage of the first low voltage DC supply signal DC1, to a voltage swing of the high voltage output signal HVO, which is about equal to the sum of the voltage of the first low voltage DC supply signal DC1 and the voltage of the battery 24. Further, when the low voltage input signal LVI is a logic LOW, the high voltage output signal HVO is a logic LOW. Conversely, when the low voltage input signal LVI is a logic HIGH, the high voltage output signal HVO is a logic HIGH.

In one embodiment of the circuit 10, a maximum voltage between the first source and the first drain is less than or equal to the voltage of the first low voltage DC supply signal DC1. In one embodiment of the circuit 10, a maximum voltage between the first gate and the first drain is less than or equal to the voltage of the first low voltage DC supply signal DC1. In one embodiment of the circuit 10, a maximum voltage between the first source and the first gate is less than or equal to the voltage of the first low voltage DC supply signal DC1.

In an exemplary embodiment of the circuit 10, the voltage of the battery 24 is about equal to the voltage of the first low voltage DC supply signal DC1 and the PFET 14 is an enhancement mode only FET. Therefore, the voltage swing of the high voltage output signal HVO is equal to about two times the voltage swing of the low voltage input signal LVI. Further, when the low voltage input signal LVI is a logic LOW, a voltage between the first source and the first gate is about equal to zero, which forces the PFET 14 to be in an OFF state. When the low voltage input signal LVI is a logic HIGH, the voltage between the first source and the first gate is about equal to the voltage of the first low voltage DC supply signal DC1, which, if the voltage of the first low voltage DC supply signal DC1 is greater than the threshold voltage of the PFET 14, forces the PFET 14 to be in an ON state.

Figure 4:
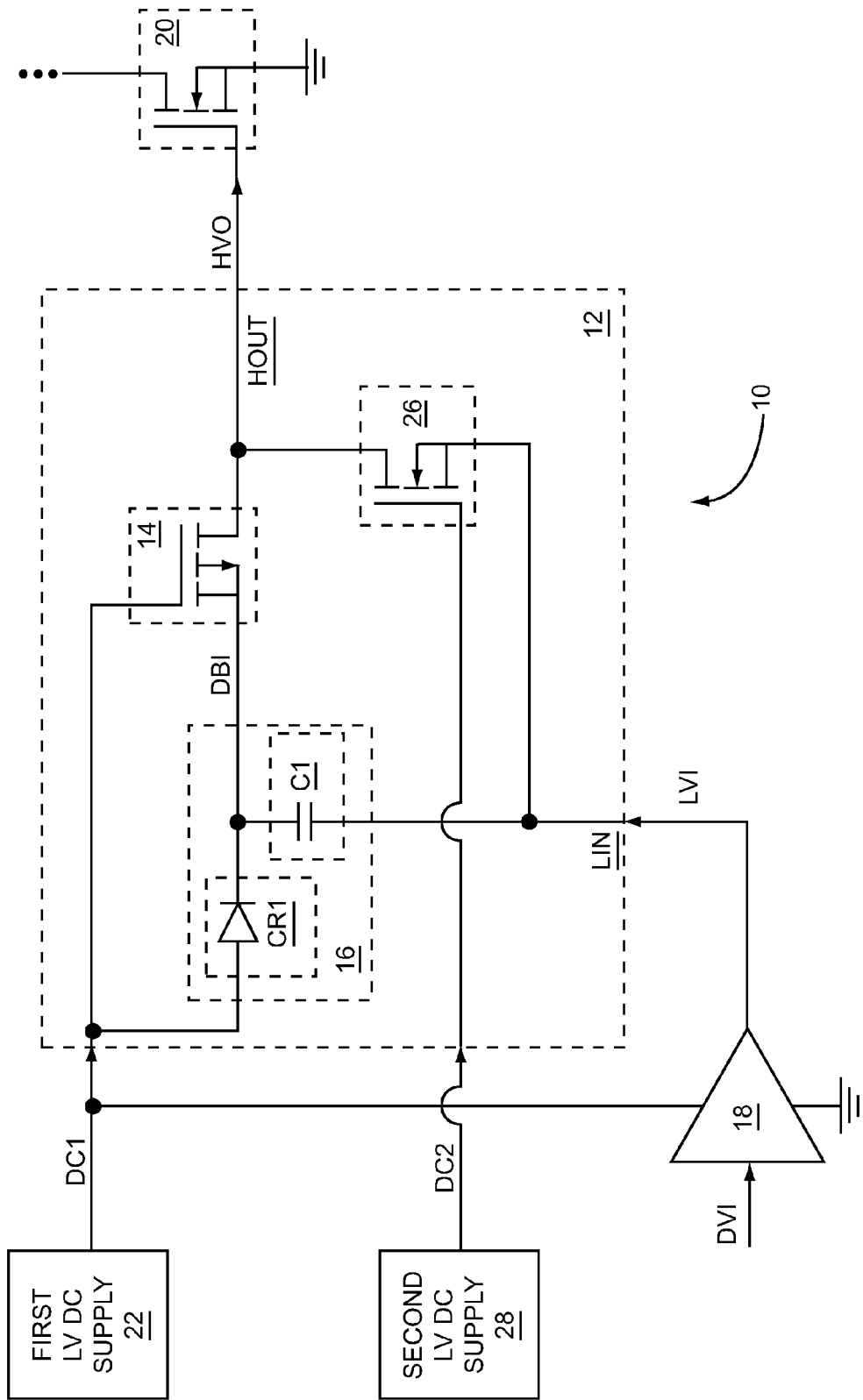
FIG. 4 illustrates the circuit, which further includes a second low voltage DC supply according to another embodiment of the circuit.

FIG. 4 illustrates the circuit 10 according to another embodiment of the circuit 10. The circuit 10 illustrated in FIG. 4 is similar to the circuit 10 illustrated in FIG. 3, except the circuit 10 illustrated in FIG. 4 further includes a second low voltage DC supply 28. Additionally, the high voltage driver 12 further includes an N-type FET (NFET) 26 and the source bias circuit 16 includes a first capacitive element C1 and a first diode element CR1. The NFET 26 has a second source, a second gate, and a second drain. The second gate is coupled to the second low voltage DC supply 28. The second source is coupled to the low voltage input LIN. The second drain is coupled to the high voltage output HOUT. The first capacitive element C1 is coupled between the low voltage input LIN and the first source. The first diode element CR1 has an anode and a cathode, such that the cathode is coupled to the first source and the anode is coupled to the first gate. In one embodiment of the high voltage driver 12, the NFET 26 functionally replaces the first resistive element R1 (FIG. 3), and the first capacitive element C1 and the first diode element CR1 functionally replace the battery 24 (FIG. 3).

In one embodiment of the circuit 10, the second gate is directly coupled to the second low voltage DC supply 28; the second source is directly coupled to the low voltage input LIN; the second drain is directly coupled to the high voltage output HOUT; the first capacitive element C1 is directly coupled between the low voltage input LIN and the first source; the first diode element CR1 has an anode and a cathode, such that the cathode is directly coupled to the first source and the anode is directly coupled to the first gate; or any combination thereof.

The first capacitive element C1 receives the low voltage input signal LVI via the low voltage input LIN. The first diode element CR1 receives and rectifies the low voltage input signal LVI to feed the first capacitive element C1. As such, the first capacitive element C1 and the first diode element CR1 provide the DC biased signal DBI based on the low voltage input signal LVI and the first low voltage DC supply signal DC1. When the low voltage input signal LVI is a logic LOW, the low voltage input signal LVI may be equal to about zero volts. As such, the first low voltage DC supply 22 charges the first capacitive element C1 through the first diode element CR1 until a voltage across the first capacitive element C1 is equal to the voltage of the first low voltage DC supply signal DC1 minus a voltage drop across the first diode element CR1, which may be equal to about 0.6 volts. When the low voltage input signal LVI transitions to a logic HIGH, the low voltage input signal LVI may transition to a voltage about equal to the voltage of the first low voltage DC supply signal DC1, thereby reverse biasing the first diode element CR1. In this regard, the first capacitive element C1 functions in a similar manner to the battery 24 (FIG. 3). However, to prevent discharge of the first capacitive element C1, the first resistive element R1 (FIG. 3) is replaced with the NFET 26.

The second low voltage DC supply 28 provides a second low voltage DC supply signal DC2. As such, the second gate receives the second low voltage DC supply signal DC2. The second source receives the low voltage input signal LVI via the low voltage input LIN. When the low voltage input signal LVI is a logic LOW, the low voltage input signal LVI may be equal to about zero volts. As previously mentioned, if the difference between the voltage of the DC biased signal DBI and the voltage of the first low voltage DC supply signal DC1 is less than the threshold voltage of the PFET 14, then the PFET 14 will be in the OFF state. Further, if the voltage of the second low voltage DC supply signal DC2 is greater than a threshold voltage of the NFET 26, then the NFET 26 will be in an ON state, thereby pulling the high voltage output signal HVO to about zero volts, which is the logic LOW.

As previously mentioned, when the low voltage input signal LVI is a logic HIGH, if the difference between the voltage of the DC biased signal DBI and the voltage of the first low voltage DC supply signal DC1 is greater than the threshold voltage of the PFET 14, then the PFET 14 will be in the ON state, thereby driving the high voltage output signal HVO to provide the logic HIGH. Further, if a difference between the voltage of the second low voltage DC supply signal DC2 and the low voltage input signal LVI is less than the threshold voltage of the NFET 26 or if the low voltage input signal LVI reverse biases the second gate/second source, then the NFET 26 will be in an OFF state. In this regard, when the PFET 14 is in the ON state, the NFET 26 is in the OFF state. Conversely, when the NFET 26 is in the ON state, the PFET 14 is in the OFF state.

In one embodiment of the high voltage driver 12, to prevent discharging the first capacitive element C1, the NFET 26 transitions from the ON state to the OFF state before the PFET 14 transitions from the OFF state to the ON state. Further, in one embodiment of the high voltage driver 12, the PFET 14 transitions from the ON state to the OFF state before the NFET 26 transitions from the OFF state to the ON state. In one embodiment of the circuit 10, the voltage of the first low voltage DC supply signal DC1 is about equal to two times a voltage of the second low voltage DC supply signal DC2.

In one embodiment of the NFET 26, the NFET 26 is a MOSFET. In an alternate embodiment of the NFET 26, the NFET 26 is a JFET. In additional embodiments of the NFET 26, the NFET 26 is any type of FET. In one embodiment of the circuit 10, a transconductance of the high gate drive voltage FET 20 is greater than a transconductance of the NFET 26. In an exemplary embodiment of the circuit 10, the turn-on gate voltage of the high gate drive voltage FET 20 is on the order of about two times the turn-on voltage of the NFET 26. In one embodiment of the circuit 10, the turn-on voltage of the high gate drive voltage FET 20 is greater than the turn-on voltage of the PFET 14. In an exemplary embodiment of the circuit 10, the turn-on voltage of the high gate drive voltage FET 20 is on the order of about two times the turn-on voltage of the PFET 14.

Figure 5:
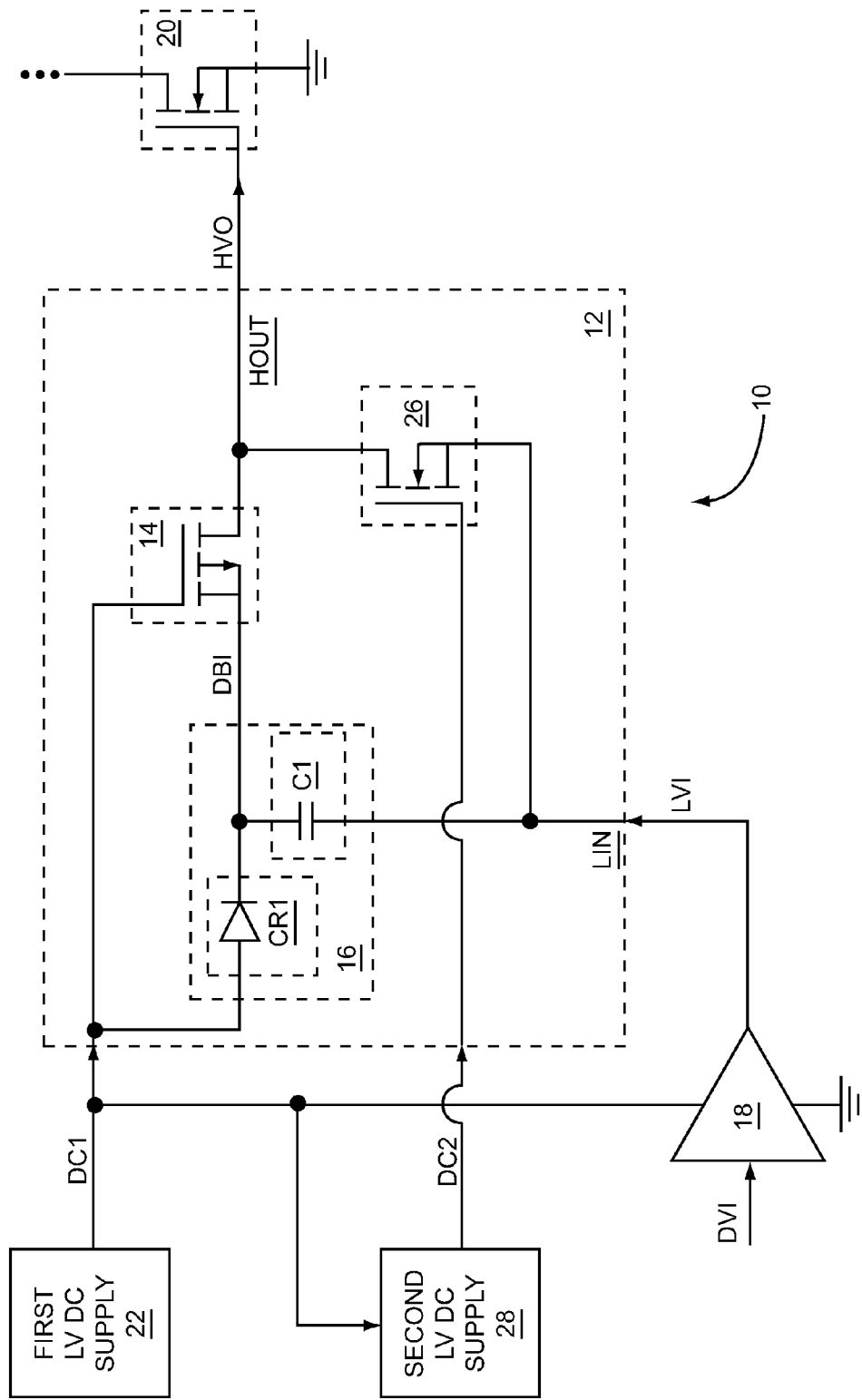
FIG. 5 illustrates the circuit according to a further embodiment of the circuit.

FIG. 5 illustrates the circuit 10 according to a further embodiment of the circuit 10. The circuit 10 illustrated in FIG. 5 is similar to the circuit 10 illustrated in FIG. 4, except in the circuit 10 illustrated in FIG. 5, the second low voltage DC supply 28 receives the first low voltage DC supply signal DC1 and provides the second low voltage DC supply signal DC2 based on the first low voltage DC supply signal DC1. In one embodiment of the circuit 10, the voltage of the first low voltage DC supply signal DC1 is about equal to two times the voltage of the second low voltage DC supply signal DC2. In one embodiment of the second low voltage DC supply 28, the second low voltage DC supply 28 is a DC-DC converter, a resistor divider, a charge pump, a linear converter, a zener diode based converter, the like, or any combination thereof.

Figure 6:
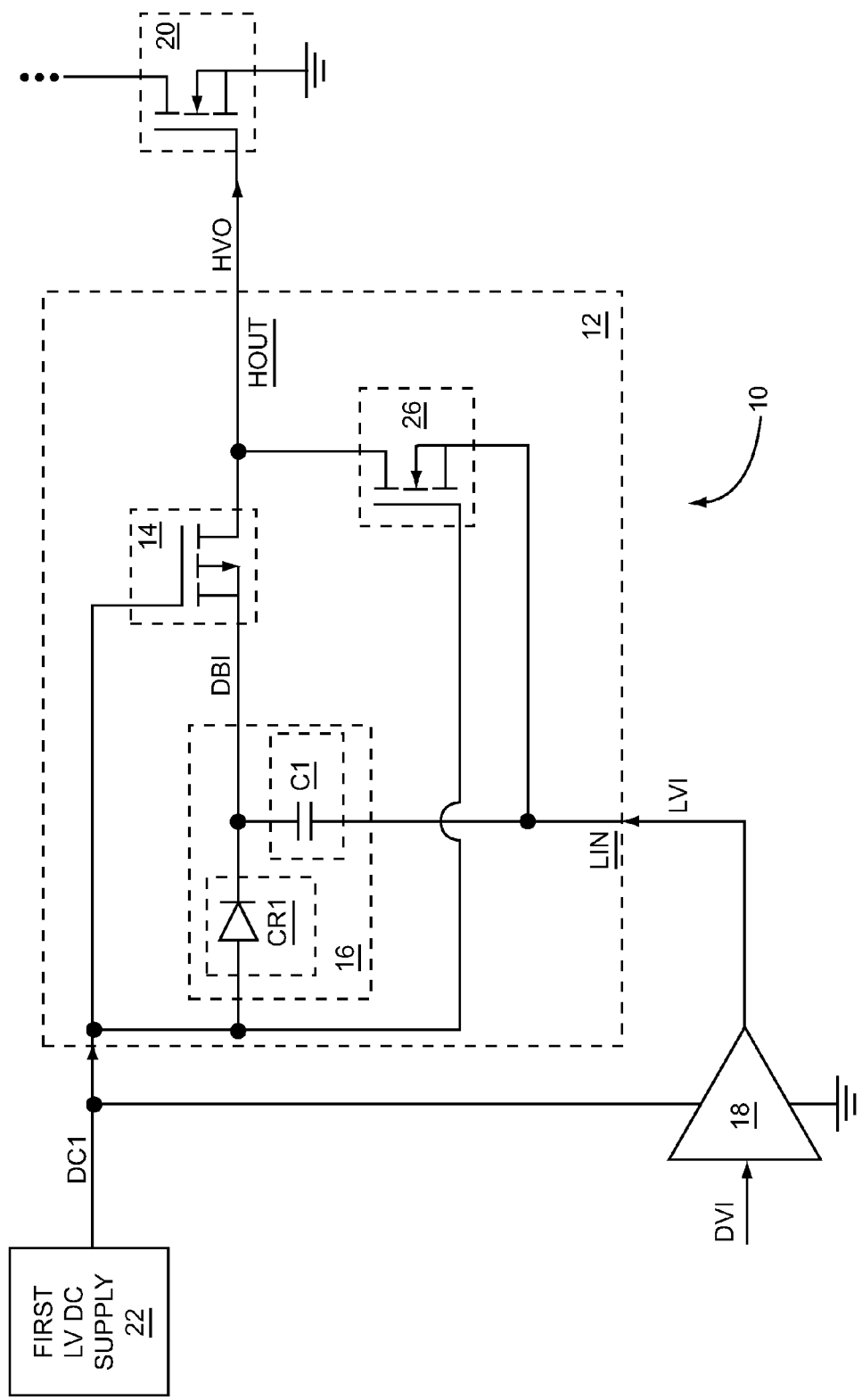
FIG. 6 illustrates the circuit according to an added embodiment of the circuit.

FIG. 6 illustrates the circuit 10 according to an added embodiment of the circuit 10. The circuit 10 illustrated in FIG. 6 is similar to the circuit 10 illustrated in FIG. 4, except in the circuit 10 illustrated in FIG. 6, the second low voltage DC supply 28 is omitted and the second gate is coupled to the first low voltage DC supply 22. In this regard, the second gate receives the first low voltage DC supply signal DC1. In one embodiment of the circuit 10, the second gate is directly coupled to the first low voltage DC supply 22.

Figure 7:
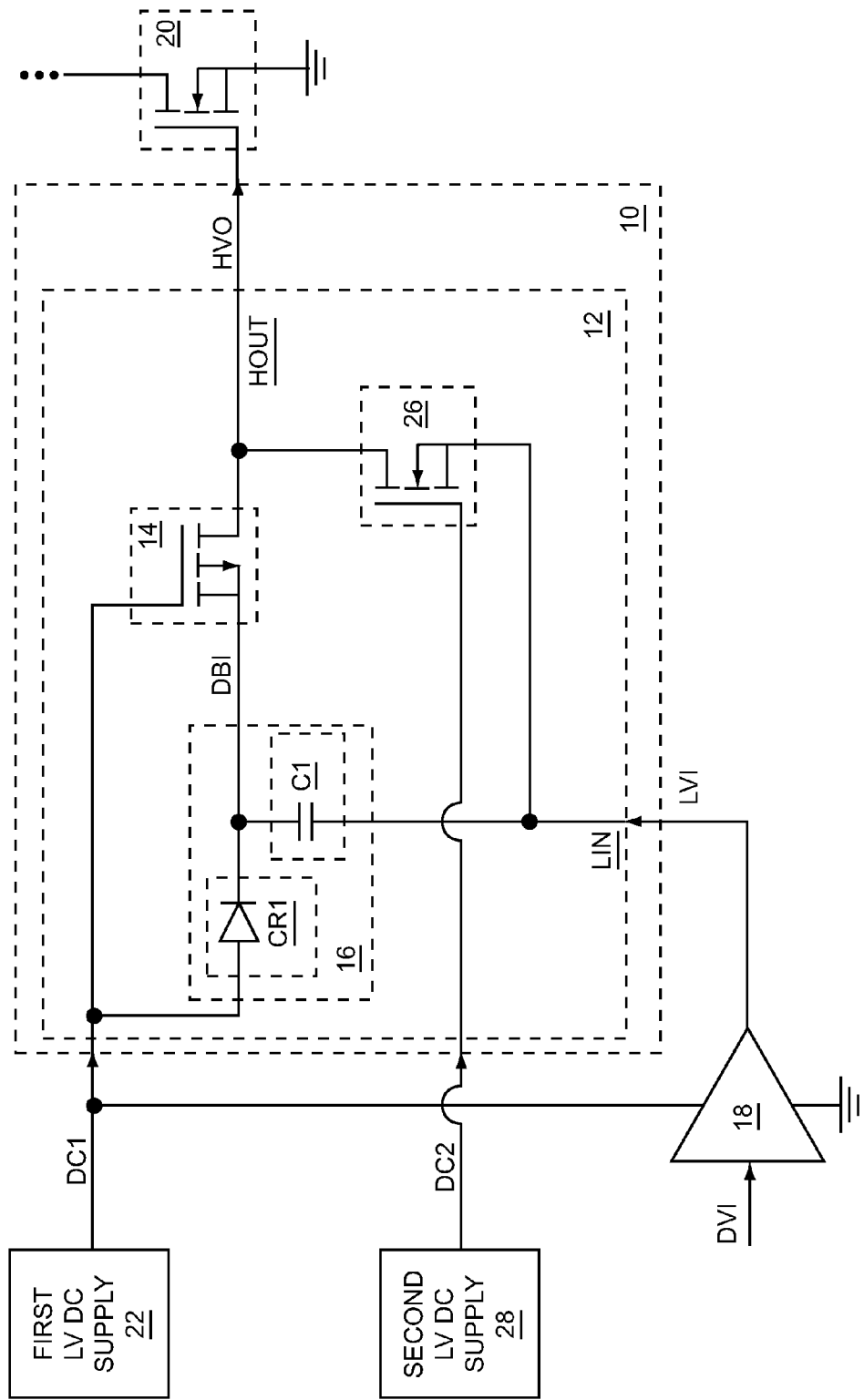
FIG. 7 illustrates the circuit according to a supplementary embodiment of the circuit.

FIG. 7 illustrates the circuit 10 according to a supplementary embodiment of the circuit 10. The circuit 10 illustrated in FIG. 7 is similar to the circuit 10 illustrated in FIG. 4, except in the circuit 10 illustrated in FIG. 7, the low voltage logic driver 18, the high gate drive voltage FET 20, the first low voltage DC supply 22, and the second low voltage DC supply 28 are provided external to the circuit 10. In alternate embodiments of the circuit 10, the circuit 10 includes any or all of the high gate drive voltage FET 20, the first low voltage DC supply 22, and the second low voltage DC supply 28. In alternate embodiments of the present disclosure, any or all of the high gate drive voltage FET 20, the first low voltage DC supply 22, and the second low voltage DC supply 28 are omitted.

Those skilled in the art will recognize improvements and modifications to the embodiments of the present disclosure. All such improvements and modifications are considered within the scope of the concepts disclosed herein and the claims that follow.

What is claimed is:

1. A circuit comprising:
   a source bias circuit adapted to apply a direct current bias to a low voltage input signal to provide a direct current biased signal; and
   a P-type field effect transistor comprising:
   a first source adapted to receive the direct current biased signal;
   a first gate adapted to receive a first low voltage direct current supply signal; and
   a first drain adapted to provide a high voltage output signal based on the direct current biased signal and the first low voltage direct current supply signal, wherein, the source bias circuit comprises:
      a first capacitive element coupled between the low voltage input and the first source and adapted to receive the low voltage input signal; and
      a first diode element having an anode and a cathode, wherein the cathode is coupled to the first source and the anode is coupled to the first gate and adapted to receive and rectify the first low voltage direct current supply signal and the source bias circuit and the P-type field effect transistor form a high voltage driver, which is adapted to receive and translate the low voltage input signal to provide the high voltage output signal.

2. The circuit of claim 1 wherein a first low voltage direct current supply is adapted to provide the first low voltage direct current supply signal.

3. The circuit of claim 2 further comprising the first low voltage direct current supply.

4. The circuit of claim 2 wherein the first low voltage direct current supply is further adapted to provide energy to translate the low voltage input signal to provide the high voltage output signal.

5. The circuit of claim 1 wherein the source bias circuit is further adapted to receive the low voltage input signal via a low voltage input and the first drain is further adapted to provide the high voltage output signal via a high voltage output.

6. The circuit of claim 5 wherein the source bias circuit comprises a battery having an anode and a cathode, wherein the cathode is coupled to the first source and the anode is coupled to the low voltage input.

7. The circuit of claim 5 further comprising an N-type field effect transistor, which comprises:
   a second source coupled to the low voltage input;
   a second gate; and
   a second drain coupled to the high voltage output.

8. The circuit of claim 7 wherein the second gate is adapted to receive the first low voltage direct current supply signal.

9. The circuit of claim 7 wherein the second gate is adapted to receive a second low voltage direct current supply signal.

10. The circuit of claim 9 wherein a second low voltage direct current supply is adapted to provide the second low voltage direct current supply signal.

11. The circuit of claim 10 further comprising the second low voltage direct current supply.

12. The circuit of claim 10 wherein the second low voltage direct current supply is further adapted to receive the first low voltage direct current supply signal, such that the second low voltage direct current supply signal is based on the first low voltage direct current supply signal.

13. The circuit of claim 9 wherein a voltage of the first low voltage direct current supply signal is about equal to two times a voltage of the second low voltage direct current supply signal.

14. The circuit of claim 7 wherein the high voltage driver is further adapted to transition the N-type field effect transistor from an ON state to an OFF state before transitioning the P-type field effect transistor from an OFF state to an ON state.

15. The circuit of claim 1 wherein:
   the first capacitive element and the first diode element are further adapted to provide the direct current biased signal based on the low voltage input signal and the first low voltage direct current supply signal.

16. The circuit of claim 1 wherein a maximum voltage between the first source and the first drain is less than or equal to a voltage of the first low voltage direct current supply signal.

17. The circuit of claim 16 wherein a maximum voltage between the first gate and the first drain is less than or equal to the voltage of the first low voltage direct current supply signal.

18. The circuit of claim 1 wherein a voltage swing of the high voltage output signal is greater than a voltage swing of the low voltage input signal.

19. The circuit of claim 18 wherein the voltage swing of the high voltage output signal is on the order of about two times the voltage swing of the low voltage input signal.

20. The circuit of claim 19 wherein the voltage swing of the high voltage output signal is equal to about 6 volts and the voltage swing of the low voltage input signal is equal to about 3.3 volts.

21. The circuit of claim 19 wherein the voltage swing of the high voltage output signal is equal to about 19.4 volts and the voltage swing of the low voltage input signal is equal to about 10 volts.

22. The circuit of claim 1 wherein a low voltage logic driver is adapted to provide the low voltage input signal.

23. The circuit of claim 22 further comprising the low voltage logic driver.

24. The circuit of claim 1 wherein a gate of a high gate drive voltage field effect transistor is adapted to receive the high voltage output signal.

25. The circuit of claim 24 further comprising the high gate drive voltage field effect transistor.

26. The circuit of claim 24 wherein the high gate drive voltage field effect transistor is a silicon carbide field effect transistor.

27. A circuit comprising:
   a high voltage driver having a low voltage input and comprising:
      a P-type field effect transistor comprising:
         a first source;
         a first gate coupled to a first low voltage direct current supply; and
         a first drain coupled to a high voltage output of the high voltage driver;
      an N-type field effect transistor, comprising:
         a second source coupled to the low voltage input;
         a second gate adapted to receive a second low voltage direct current supply signal from a second low voltage direct current supply separate from the first low voltage direct current supply; and
         a second drain coupled to the high voltage output;
      a source bias circuit coupled between the low voltage input and the first source; and a low voltage logic driver coupled to the low voltage input, wherein a voltage swing capability of the high voltage output is greater than a voltage swing capability of the low voltage input.

28. The circuit of claim 27 wherein the second gate is adapted to receive the second low voltage direct current supply signal from both the first low voltage direct current supply and the second low voltage direct current supply.

29. A circuit comprising:
a high gate drive voltage field effect transistor; and
a high voltage driver having a low voltage input and comprising:
  a P-type field effect transistor comprising:
    a first source;
    a first gate coupled to a first low voltage direct current supply and adapted to receive a low voltage direct current supply signal; and
    a first drain coupled to a gate of the high gate drive voltage field effect transistor via a high voltage output of the high voltage driver, the P-type field effect transistor adapted to provide a high voltage output signal based on the low voltage direct current supply signal;
  an N-type field effect transistor, comprising:
    a second source coupled to the low voltage input;
    a second gate adapted to receive a second low voltage direct current supply signal from a second low voltage direct current supply separate from the first low voltage direct current supply; and
    a second drain coupled to the high voltage output; and
  a source bias circuit coupled between the low voltage input and the first source,
  wherein a voltage swing capability of the high voltage output is greater than a voltage swing capability of the low voltage input.

30. The circuit of claim 29 wherein the high gate drive voltage field effect transistor is a silicon carbide field effect transistor.

31. The circuit of claim 29 wherein the second gate is adapted to receive the second low voltage direct current supply signal from both the first low voltage direct current supply and the second low voltage direct current supply.

* * * * *